US006488778B1

(12) United States Patent
Ballantine et al.

(10) Patent No.: US 6,488,778 B1
(45) Date of Patent: Dec. 3, 2002

(54) APPARATUS AND METHOD FOR CONTROLLING WAFER ENVIRONMENT BETWEEN THERMAL CLEAN AND THERMAL PROCESSING

(75) Inventors: Arne W. Ballantine, Cold Spring, NY (US); Peter A. Emmi, Hyoe Park, NY (US); Walter J. Frey, Waterbury Center, VT (US); Michael J. Gambero, Colchester, VT (US); Neena Garg, Fishkill, NY (US); Byeongju Park, Wappingers Falls, NY (US); Donald L. Wilson, New Windsor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/527,698

(22) Filed: Mar. 16, 2000

(51) Int. Cl.[7] ............... C23C 16/00; B65H 1/00; B65G 1/133
(52) U.S. Cl. ............ 118/719; 118/724; 118/725; 414/217; 414/222.01; 414/222.07; 414/222.09; 414/222.12; 414/222.13; 414/331.01; 414/331.14; 414/331.18; 414/935; 414/937; 414/939
(58) Field of Search ................ 118/719, 724, 118/725; 414/217, 217.1, 222.01, 222.07, 222.12, 331.01, 331.14, 331.18, 332, 403, 935, 937, 939, 940, 222.09, 222.13

(56) References Cited

U.S. PATENT DOCUMENTS 4,405,435 A * 9/1983 Tateishi ............... 204/298

(List continued on next page.)

FOREIGN PATENT DOCUMENTS

| JP | 3-54844 | * | 3/1991 |
| JP | 5-47805 | * | 3/1993 |
| JP | 11-251254 | * | 9/1999 |
| JP | 11-270970 | * | 10/1999 |

OTHER PUBLICATIONS

Component Attachment Method, IBM Technical Disclosure Bulletin, Dec. 1986 vol. 29 Issue 7 pp. 2951–2952.*

Robotic Component Removal Tool, IBM Technical Disclosure Bulletin, Apr. 1994, vol. 37 Issue 4A pp. 389–394.*

Primary Examiner—Jeffrie R. Lund
(74) Attorney, Agent, or Firm—Downs Rachlin Martin PLLC

(57) ABSTRACT

An apparatus and method for controlling wafer temperature and environment is provided. The apparatus includes a batch processing fixture for batch processing wafers at a first elevated temperature. The batch of wafers is not substantially ramped in temperature within the batch processing fixture. The apparatus also includes a single wafer processing apparatus for rapidly ramping temperature of a wafer of the batch from the first elevated temperature wherein a uniform temperature across the wafer is maintained during the ramping. Another embodiment of the apparatus (10) includes an RTP chamber (20) having an inert or reducing environment and that includes a pedestal (24) for holding a single wafer (16) and a heater unit (22) arranged so as to uniformly and rapidly heat the single wafer. The apparatus also includes a cooling chamber (30) having an inert or reducing environment and located adjacent the RTP chamber and selectively open thereto, and includes a pedestal (34) for holding the single wafer, a first loading chamber (40) having an inert or reducing environment and located adjacent the cooling chamber and selectively opened thereto, and having a cassette (44) for holding one or more wafers. The apparatus also includes a thermal processing chamber (50), such as an LPCVD furnace, located adjacent the loading chamber and arranged to receive the cassette so as to perform a thermal process of the wafers in the cassette.

52 Claims, 4 Drawing Sheets

U.S. PATENT DOCUMENTS

| | | | |
|---|---|---|---|
| 4,923,584 A | 5/1990 | Bramhall, Jr. et al. | 204/298 |
| 5,058,526 A | 10/1991 | Matsushita et al. | 118/715 |
| 5,076,205 A | 12/1991 | Vowles et al. | 118/719 |
| 5,127,365 A | 7/1992 | Koyama et al. | 118/724 |
| 5,186,718 A * | 2/1993 | Tepman et al. | 29/25.01 |
| 5,217,501 A * | 6/1993 | Fuse et al. | 29/25.01 |
| 5,259,881 A | 11/1993 | Edwards et al. | 118/719 |
| 5,271,732 A | 12/1993 | Yokokawa | 432/241 |
| 5,380,682 A | 1/1995 | Edwards et al. | 437/225 |
| 5,445,676 A | 8/1995 | Takagi | 118/719 |
| 5,565,034 A * | 10/1996 | Nanbu et al. | 118/668 |
| 5,609,689 A * | 3/1997 | Kato et al. | 118/719 |
| 5,674,786 A * | 10/1997 | Turner et al. | 437/225 |
| 5,697,749 A | 12/1997 | Iwabuchi et al. | 414/217 |
| 5,766,360 A * | 6/1998 | Sato et al. | 118/666 |
| 6,139,695 A * | 10/2000 | Washburn et al. | 204/192.12 |
| 6,260,894 B1 * | 7/2001 | Minnick et al. | 294/1.1 |

* cited by examiner

APPARATUS AND METHOD FOR CONTROLLING WAFER ENVIRONMENT BETWEEN THERMAL CLEAN AND THERMAL PROCESSING

FIELD OF THE INVENTION

The present invention relates to the processing of wafers in semiconductor manufacturing. More particularly it relates to apparatus and methods for eliminating unwanted native oxide growth when transporting wafers in a semiconductor manufacturing line. It also relates to preventing wafer slip during heating or cooling steps.

BACKGROUND OF THE INVENTION

The manufacturing of semiconductor devices, such as integrated circuits and the like, involves subjecting a silicon wafer to numerous process steps using a variety of different apparatus. Great care is required to ensure that the wafer is not exposed to unwanted influences, like dust particles, particular chemical reactants, or unwanted extremes in temperature and humidity. Accordingly, the wafer is typically transported in a box to each different apparatus in a cleanroom environment which has a controlled atmosphere.

One of the more daunting problems in the processing of silicon wafers in semiconductor manufacturing is the growth of unwanted oxide on the wafer surface while the wafer is being transported between processing apparatus. For many of the process steps, a pure silicon surface is required. Yet, when such a surface is exposed to air, a native oxide layer inevitably forms thereon.

This problem is presently addressed by subjecting a wafer either to a dry thermal process in a reducing environment or a wet chemical dip immediately before the processing step which requires an oxide free wafer surface. However, in the case of a dry thermal reduction, the process is typically performed at temperatures of about 1000° C. or greater.

Unfortunately, such prolonged exposure to high temperature can result in excess diffusion of the structures formed in or on the silicon, and prevents the formation of shallow junctions, which are desirable in state-of-the-art devices. In other cases, when the next process is an LPCVD furnace deposition or anneal, there is presently no way to perform the oxide reducing step and then transport the wafer to the LPCVD furnace without exposing the wafer to air. Accordingly, during the transportation step, an oxide layer, whose thickness is proportional to the amount of time exposed to air, is formed.

Correspondingly, in the case of wet surface cleaning, a time window must be imposed between the wet process and the subsequent processing step requiring the clean surface in order to avoid formation of a native oxide.

Another problem associated with wafer processing is called "wafer slip," which is a displacement of the crystal planes when a sufficiently large thermal gradient is created across a wafer. As LPCVD and oxidation/anneal furnaces are batch systems, there is no active cross-wafer temperature control. During a heating step of a batch of wafers, because heat flows from heating coils located outside the batch of wafers, outside edges of the wafers heat up before center regions of the wafers. Similarly, during cooling, outside edges of the wafers cool before center regions. The uneven heating or cooling provides the thermal stress which can induce wafer slip if the magnitude of thermal stress is sufficient. Therefore, batch apparatus can induce wafer slip if ramping up or ramping down the temperature is performed at too high a rate of temperature change. Certain single wafer rapid thermal process tools (RTP) address this problem by providing cross-wafer temperature control during temperature ramp-up and ramp-down. In some cases this is accomplished with a thermal chuck contacting the entire back surface of the wafer that provides for more uniform heating or cooling. Alternatively, individual lamps or groups of lamps can be controlled to provide for more uniform cross wafer heating or cooling. However, as mentioned above, the RTP tools are single wafer tools which can greatly reduce wafer throughput for processes that require a very long hot process step, such as a long anneal, deposition, or oxidation.

U.S. Pat. Nos. 5,380,682 and 5,259,881 issued to Edwards et al. ("the Edwards patents") disclose a wafer processing cluster tool having a wafer batch pre-heating module that preheats all wafers in a batch. At the completion of the pre-heating, the wafers are transported through a load-lock one by one. A rapid thermal anneal station then heats the wafer to high temperature.

U.S. Pat. No. 5,271,732 to Yokokawa (the '732 patent) discloses a heat treatment apparatus for wafers which includes a load-lock chamber, and which allows for flow of treatment gas within the environment.

SUMMARY OF THE INVENTION

The present invention relates to the processing of wafers in semiconductor manufacturing, and in particular relates to apparatus and methods for eliminating unwanted native oxide growth when transporting wafers in a semiconductor manufacturing line and preventing wafer slip during heating or cooling steps of a particular process. This is accomplished in this invention by processing at fixed temperature in a batch mode and ramping temperature in a single wafer processing mode. In one embodiment a rapid thermal cleaning process is combined with a batch oxidation, deposition, or anneal process.

Accordingly, a first aspect of the invention is a multi-chamber tool comprising a first hot process chamber and a second hot process chamber. The tool also includes a temperature controlled wafer handler for transporting a wafer from the first hot process chamber to the second hot process chamber.

A second aspect of the invention is a system for processing wafers comprising a first chamber for single wafer processing and a second chamber for batch processing. The tool also includes a wafer handler system for moving a wafer from the first chamber to the second chamber.

A third aspect of the invention is a wafer processing tool, comprising a batch processing fixture for batch processing a plurality of wafers at a first elevated temperature. The batch of wafers is not cooled from that elevated temperature within the batch processing fixture. The tool also includes a first single wafer processing apparatus for rapidly cooling a wafer of the batch of wafers without first heating the wafer from the first elevated temperature. The single wafer processing apparatus includes a chuck to maintain a uniform temperature across the wafer during cooling.

A fourth aspect of the invention is a wafer processing tool, comprising a batch processing fixture for batch processing a plurality of wafers at a first elevated temperature. The batch of wafers is not substantially ramped in temperature within the batch processing fixture. The tool also includes a single wafer processing apparatus for rapidly ramping temperature of a wafer of the batch of wafers from the first elevated temperature. The single wafer processing apparatus also includes a chuck to maintain a uniform temperature across the wafer during the ramping.

A fifth aspect of the invention is a method of processing wafers. The method includes the step of providing a batch of wafers in a batch processing fixture for batch processing the wafers at a first elevated temperature. The next step is moving a wafer of the batch to a single wafer processing apparatus. The next step is rapidly cooling the wafer, wherein a uniform temperature across the wafer is maintained during the cooling. There is no rapid heating step between the batch processing step and the rapid cooling step.

A sixth aspect of the invention is a method of processing wafers. The method includes the step of providing a batch of wafers in a batch processing fixture for batch processing the wafers at a first elevated temperature. The batch of wafers is not substantially ramped in temperature within the batch processing fixture. Next a wafer of the batch is moved to a single wafer processing apparatus for ramping in temperature from the elevated temperature. The next step is rapidly ramping the temperature of the wafer from the first elevated temperature, wherein a uniform temperature across the wafer is maintained during the ramping.

A seventh aspect of the invention is a method of processing wafers. The method comprises the steps of first, placing a wafer on a pedestal and rapidly heating the wafer in a reducing environment to remove oxide from the wafer, then removing the wafer from the pedestal and placing the wafer in an inert or reducing environment in a cassette surrounded by an isothermal chamber, then, when the cassette has a desired number of wafers stored therein, thermally processing the wafers stored therein, then removing the wafers from the cassette and placing each wafer in an inert or reducing environment on a pedestal pre-heated to match the temperature of the wafer, and then finally rapidly cooling the wafer.

An eighth aspect of the invention is a method of processing wafers. The method comprises the step of placing each wafer one at a time on a pedestal and rapidly heating the wafer in a reducing environment to remove oxide from the wafer. Next cooling each wafer one at a time to a predetermined temperature in an inert or reducing environment. Then transferring each wafer one at a time to a cassette located in an inert or reducing environment so that each wafer in the cassette is at substantially the same temperature. Then thermally processing the wafers in the cassette.

DETAILED DESCRIPTION OF THE INVENTION

The present invention relates to the processing of wafers in semiconductor manufacturing, and in particular relates to apparatus and methods for reducing or eliminating unwanted native oxide growth and/or wafer slip when transporting wafers in a semiconductor manufacturing line. In general, the invention provides for heating a single wafer at a time to speed heating while avoiding slip. In one aspect of the invention wafers are batched together at the elevated temperature for processing at that temperature. The wafers are then separated and cooled a single wafer at a time to speed cooling while avoiding slip. Thus, the invention provides the advantages of single wafer processing and batch processing. For example, the invention permits a reduction in the thermal budget experienced by each wafer because of the very rapid heating and cooling permitted by single wafer temperature ramping.

Alternatively, the single wafer processing may only be needed for the cooling step which is more sensitive to causing slip than heating steps. In another alternative, the single wafer heating step may include a single wafer processing step before the batch processing step, such as a hydrogen anneal to reduce thermal oxide in wafer contacts, such as emitter contacts.

Figure 1:
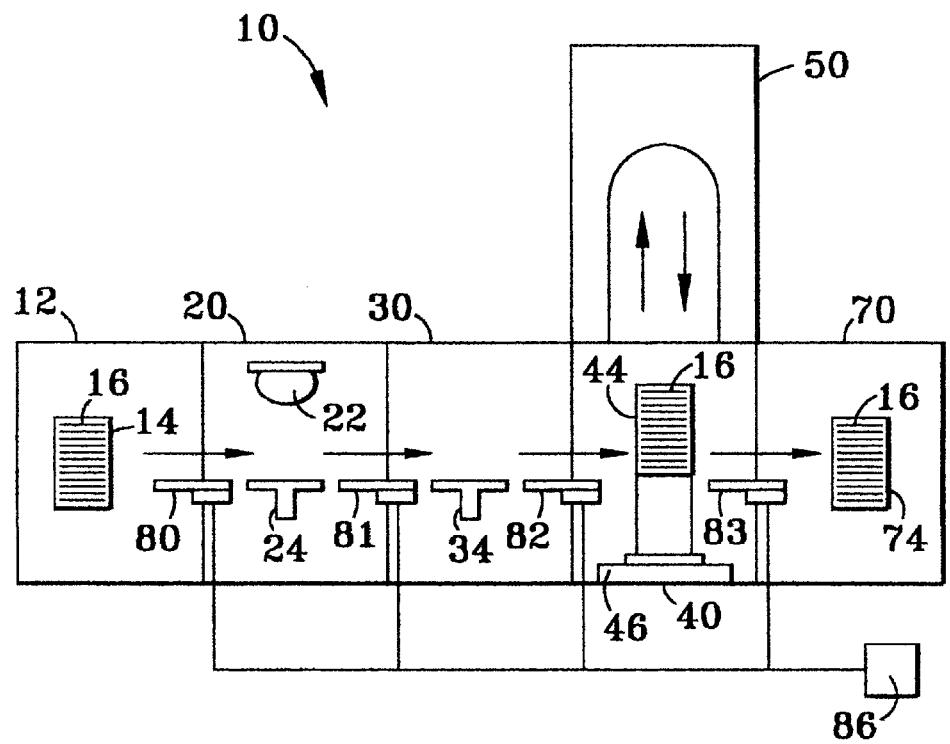
FIG. 1 is a side view schematic diagram of a first in-line wafer processing apparatus of the present invention.

With reference to FIG. 1, a first embodiment of the present invention is an in-line wafer processing apparatus 10 comprising a first loading chamber 12 having a cassette 14 capable of holding a plurality of wafers 16. Adjacent loading chamber 12 is a RTP chamber 20 for performing a hot process. As used herein, including in the claims, "hot processes" include without limitation hydrogen annealing, growth of a thin oxide, deposition of a dielectric material including a high K dielectric material (e.g., zirconium oxide), growth of nitride on silicon, deposition of a metal, deposition of a semiconductor material, and growth of a silicide. Chamber 20 is selectively open to chamber 12 and has a pedestal 24 for holding a single wafer 16. A heating device 22, such as an array of heating lamps, is also provided in chamber 20 adjacent pedestal 24 for radiatively heating a wafer 16 when it is placed on the pedestal. Depending upon the hot process to be performed, the atmosphere within chamber 20 may contain an inert gas to prevent oxidation of wafer 16. Inert gases include argon, helium, and nitrogen. For atmospheric pressure systems any oxygen in the inert gas should have a concentration less than 10 ppm to prevent oxygen reactions with the substrate. For ultra-high vacuum systems, such as molecular beam epitaxy, oxygen concentration may need to be lower, in the 5 ppb range. A reducing atmosphere can also be used to avoid oxidation. A reducing atmosphere can include hydrogen, carbon monoxide, or other well known reducing components.

Adjacent chamber 20 is a cooling chamber 30 selectively open to chamber 20 and having a pedestal 34 for holding a single wafer 16. Typically, although not necessarily, the atmosphere within chamber 30 contains an inert or reducing gas to prevent oxidation of wafer 16.

Adjacent chamber 30 is a second loading chamber 40 selectively open to chamber 30 and having a cassette 44 for holding a plurality of wafers 16. Cassette 44 is preferably made of quartz or silicon carbide. Typically, although not necessarily, the atmosphere within chamber 40 contains an inert or reducing gas to prevent oxidation of wafers 16 stored within cassette 44.

With continuing reference to FIG. 1, apparatus 10 further includes a thermal processing chamber 50, such as an LPCVD chamber, for performing a hot process. Chamber 50 is selectively open to second load chamber 40 and located adjacent and above the second load chamber. Thermal processing chamber 50 is arranged to receive cassette 44 from chamber 40. A cassette lifter 46 supports cassette 44 for lifting this cassette into thermal processing chamber 50 and returning the cassette to chamber 40 after processing. Thermal processing chamber 50 is preferably one of the known LPCVD chambers in the art, such as described in U.S. Pat. Nos. 4,699,805 and 5,653,810, which are herein incorporated by reference.

Adjacent chamber 40 opposite chamber 30 is an unloading chamber 70 selectively open to chamber 40 having a cassette 74 for holding a plurality of wafers 16.

Apparatus 10 also includes wafer handlers 80–83 electronically connected to a wafer handler control unit 86. Wafer handler 80 transports wafers between cassette 14 and pedestal 24, wafer handler 81 transports wafers between pedestal 24 and pedestal 34, wafer handler 82 transports wafers between pedestal 34 and cassette 44, and wafer handler 83 transports wafers between cassette 44 and cassette 74. The temperature of the environment in which wafer handlers 80–83 operate may be controlled by lamp heaters, resistive heaters or other heating devices so as to control the temperature of wafers 16 being transported so that the temperature of the wafers is maintained constant or changes in accordance with a selected temperature change profile, as desired. In addition, or as an alternative, wafer handlers 80–83 may include resistive heating elements or other heat sources within or adjacent their wafer support structure for controlling the temperature of wafer 16 during transport so that temperature changes of the wafer occurs in accordance with a selected temperature change profile.

In a first mode, apparatus 10 operates as follows. First, wafers 16 are loaded into cassette 14 in chamber 12. Wafer handler 80 then transfers a wafer 16 from cassette 14 to pedestal 24 located in chamber 20. This wafer 16 is then rapidly heated in connection with performance of a hot process operation. This hot process operation, for example, may involve removing oxide from the wafer by heating the wafer in a reducing environment. In some cases, it may be desirable to include hydrogen in the reducing environment and rapidly heat the wafer to a temperature of 800° C.–1200° C. so as to hydrogen pre-bake the wafer. Wafer handler 81 is then activated and transfers wafer 16 from pedestal 24 to pedestal 34 located in chamber 30, where the wafer is allowed to cool in accordance with a cooling regime designed to achieve as uniform cooling across the entire wafer as possible. Typically, this cooling is performed at a rate of between 10° C.–100° C. per second, which rate may vary as a function of changes in wafer temperature during the cooling process. When this wafer 16 has cooled to an appropriate (i.e., predetermined) temperature (e.g., 200° C.), wafer handler 82 is activated and transfers the wafer to cassette 44. The above process is repeated for the remaining wafers in cassette 14 until all the wafers therein are transferred to cassette 44. In this way, all wafers 16 present in cassette 44 have undergone the same heating and cooling cycle and are at the same temperature. This low temperature is in contrast to having wafers 16 loaded directly from pedestal 24 of chamber 20 into cassette 44 at a high temperature, which would result in the wafers at one end of cassette 44 having a different temperature than those at the opposite end. This type of temperature differential would result in different LPCVD or thermal processing parameters, and would create non-uniformities in the processing of the wafers.

When cassette 44 is fully loaded, the cassette is lifted into thermal processing chamber 50 via cassette lifter 46, and the thermal process (e.g., CVD process) is performed. Cassette lifter 46 then lowers cassette 44 to chamber 40. Wafer handler 83 is then activated and transfers the processed wafers 16 therein to cassette 74 in unloading chamber 70 for removal from apparatus 10.

In a second mode of operation, wafers 16 are transported in reverse order through apparatus 10 (i.e., in a direction opposite that indicated by the arrows in FIG. 1). In this second mode of operation, as well as in the first mode described above, heating wafer handlers 80–83, or controlling the temperature of the environment in which the wafer handlers operate, during movement of wafers 16 between process chambers further contributes to all wafers undergoing substantially identical temperature change regimes.

Figure 2:
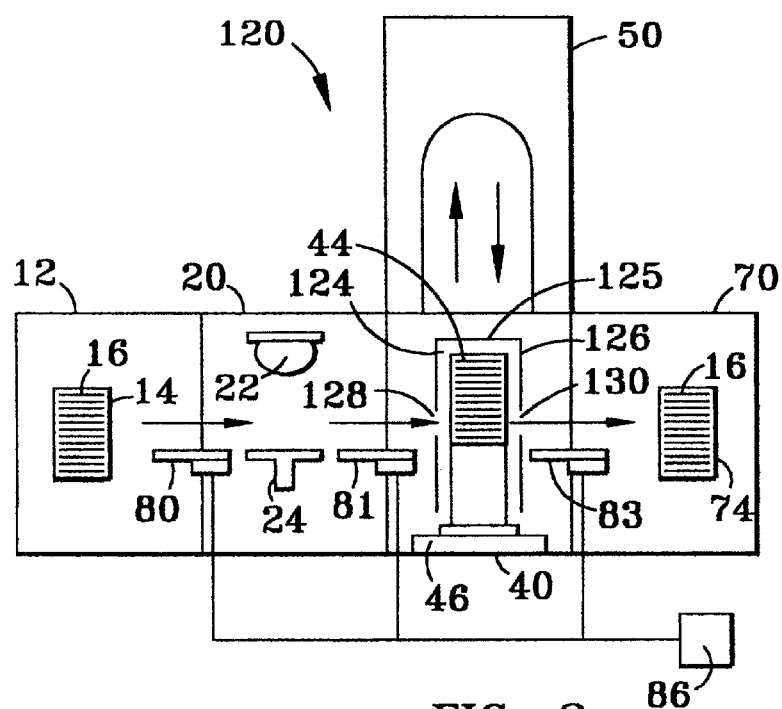
FIG. 2 is a side view schematic diagram of a second in-line wafer processing apparatus of the present invention.

With reference now to FIG. 2, a second embodiment of an in-line wafer processing apparatus 120 according to the present invention is now described. Apparatus 120 includes the same elements as apparatus 120 described above, except that chamber 30 and wafer handler 82 are not present. In addition, chamber 40 includes an isothermal chamber 124 surrounding cassette 44, which is designed to maintain wafers 16 within cassette 44 at a fixed temperature, e.g., between about 500° C. and 1100° C. Hot processes may be performed in chamber 40 as a result of the presence of isothermal chamber 124. Isothermal chamber 124 has a top 125 and sidewalls 126, with apertures 128 and 130 arranged such that wafer handlers 81 and 83 can transport wafers 16 to and from cassette 44, respectively. Chamber 124 is heated by either a heating element within sidewalls 126, a thermal mass in contact therewith, by the flow of a hot gas therethrough, or a combination thereof. In particular with respect to this embodiment of the present invention, it is desirable that wafer handler 81 contain within or adjacent its wafer support structure resistive heater elements (not shown) or other heating devices. These heating devices allow wafers 16 to be transferred from RTP chamber 20 to isothermal chamber 124 while maintaining uniform temperature across the wafer. They allow the transfer either at a substantially constant temperature or at controlled rate of change of temperature. In either case space rate of change of temperature across the wafer is held at zero. Similarly, it may be desirable to provide resistive heater elements or other heating devices in wafer handler 83 to maintain, or control changes in, the temperature of wafers 16 during transport while maintaining uniform temperature across the wafer.

Accordingly, apparatus 120 allows for wafers 16 to be loaded from pedestal 24 in chamber 20 into cassette 44 without having to go through a cool-down stage in a separate chamber. When cassette 44 is loaded with wafers 16, isothermal chamber 124 is removed (or alternatively, top 125 is removed or opened) and cassette 44 is lifted into chamber 50 by cassette lifter 46. CVD processing of the wafers is then initiated. Thereafter, cassette lifter 46 lowers cassette 44 to chamber 40. Wafer handler 83 is then activated and transfers the processed wafers 16 therein to cassette 74 in unloading chamber 70 for removal from apparatus 10, as described above in connection with apparatus 100.

Figure 3A:
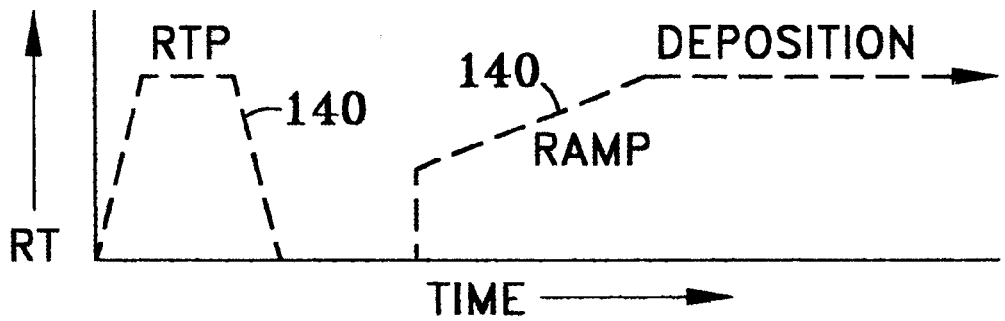
FIG. 3a is a plot of the temperature profile of wafer temperature vs. time for prior art processing of a wafer from the removal of oxide step through the LPCVD step.

With reference now to FIG. 3a, curve 140 therein shows the prior art temperature cycle for processing a wafer from the oxidation reduction step through the LPCVD process. Curve 140 shows how the temperature drops drastically between the RTP step and the deposition step. This is undesirable because the additional temperature ramping required increases wafer processing time and wafer thermal stress. Furthermore, in most cases in the prior art, wafers are exposed to clean room air while they are transported from the surface cleaning RTP step and the thermal processing (LPCVD) furnace step. As they are exposed to air, native oxide will be allowed to grow again, significantly reducing the benefit of the cleaning process in removing native oxide.

Figure 3B:
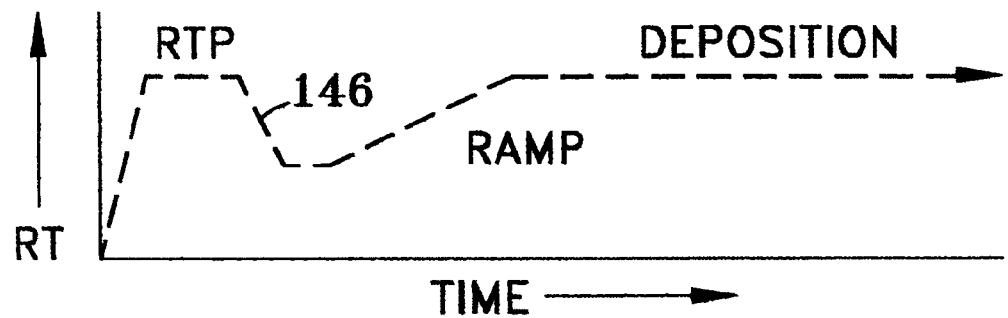
FIG. 3b is a plot of the temperature profile of wafer temperature vs. time for processing of a wafer from the removal of oxide step through the LPCVD step using apparatus and methods of the present invention.

With reference now to FIG. 3b, curve 146 shows the temperature cycle for processing a wafer using the system of the present invention from oxidation reduction step through LPCVD process. The thermal cycle illustrated in curve 146 represents a major difference in the magnitude and rate of temperature drop between the RTP step and the deposition step from that of FIG. 3a, curve 140. In addition, in curve 146, the temperature between processes remains at some intermediate temperature thereby reducing the temperature excursion between those processes. This reduces processing time (i.e., soak time to temperature for the wafers in the batch process) and eliminates the potential for wafer slip occurring between the two processing steps.

Figure 4:
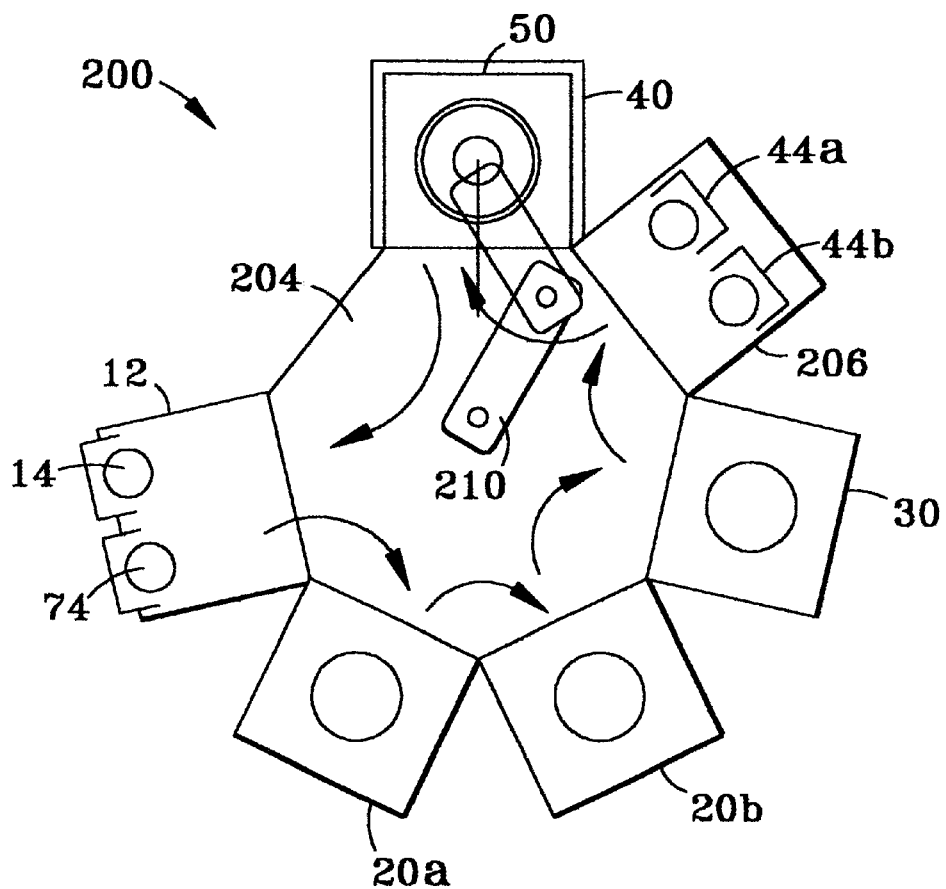
FIG. 4 is a schematic plan view of a first cluster-type e wafer processing apparatus of the present invention.

With reference now to FIG. 4, a first cluster-type wafer process apparatus 200 according to the present invention is described. Apparatus 200 comprises the same elements described above in connection with apparatus 10 and 120, except with the following differences. Chambers 12, 20a, 20b, 30, 40 and 50 are arranged adjacent the sides of a central chamber 204 which is preferably polygonal (e.g., chamber 204 is shown as hexagonal, although other configurations may be used) and are selectively opened thereto. For purposes of illustration only, load chamber 40 is shown slightly larger than thermal processing chamber 50. Chambers 20a and 20b are RTP chambers like chamber 20 described above in connection with apparatus 10 of FIG. 1. Chamber 12 also serves as a load/unload chamber and includes both cassettes 14 and 74, eliminating the need for a separate unload chamber, such as chamber 70 of apparatus 10 and 120.

Apparatus 200 additionally includes a buffer chamber 206 that includes cassettes 44a and 44b and stores wafers coming from single wafer RTP chambers 20a, and 20b. When buffer chamber 206 is filled sufficiently to create a full load of wafers 16, the wafers are loaded into load chamber 40. Then the wafers 16 are transferred to thermal processing chamber 50. Alternatively, wafers 16 may be loaded individually from buffer chamber 206 to load chamber 40. Furthermore, rather than having separate wafer handlers 80–83, apparatus 200 includes a single wafer handler 210 capable of handling and transferring wafers between the various pedestals and cassettes within chamber 204.

Accordingly, with continuing reference to FIG. 4, apparatus 200 operates in a manner similar to apparatus 10 as described above. In particular, with regard to apparatus 200, first, wafers 16 are loaded through load/unload loadlocks (not shown) in chamber 12. This allows atmospheric air to be pumped out, and an inert gas (nitrogen or argon to be backfilled) as appropriate to the process being performed. Next, wafers 16 are moved, one wafer at a time, into RTP chambers 20a and 20b for the interface reduction/oxidation process. Having more than one RTP chamber allows the RTP throughput to match the throughput of thermal processing chamber 50.

Next, wafers 16 are moved from RTP chambers 20a and 20b to cooldown chamber(s) 30 for cooling. Then, wafers 16 are moved from cooldown chamber 30 to cassettes 44a and 44b in buffer chamber 206. The latter is typically filled with wafers 16 until a sufficient number of wafers are assembled to fill the LPCVD chamber 50. Thereafter, wafers 16 are moved to load chamber 40. Alternatively, wafers 16 may be moved individually or in numbers fewer than an entire load, to load chamber 40. Then, wafers 16 present in load chamber 40 are moved into thermal processing chamber 50, and the LPCVD process is conducted.

After LPCVD or other thermal processing, wafers 16 may be stored again in buffer chamber 206. Then, wafers 16 are moved from the buffer chamber 206 to chamber 12 for unloading. Alternatively, wafers 16 may be moved directly from load chamber 40 to chamber 12.

Figure 5:
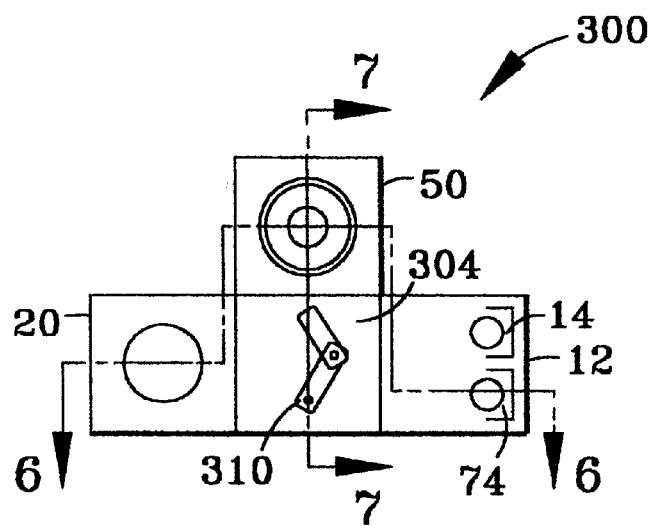
FIG. 5 is a schematic plan view of a second cluster-type wafer processing apparatus of the present invention.
Figure 6:
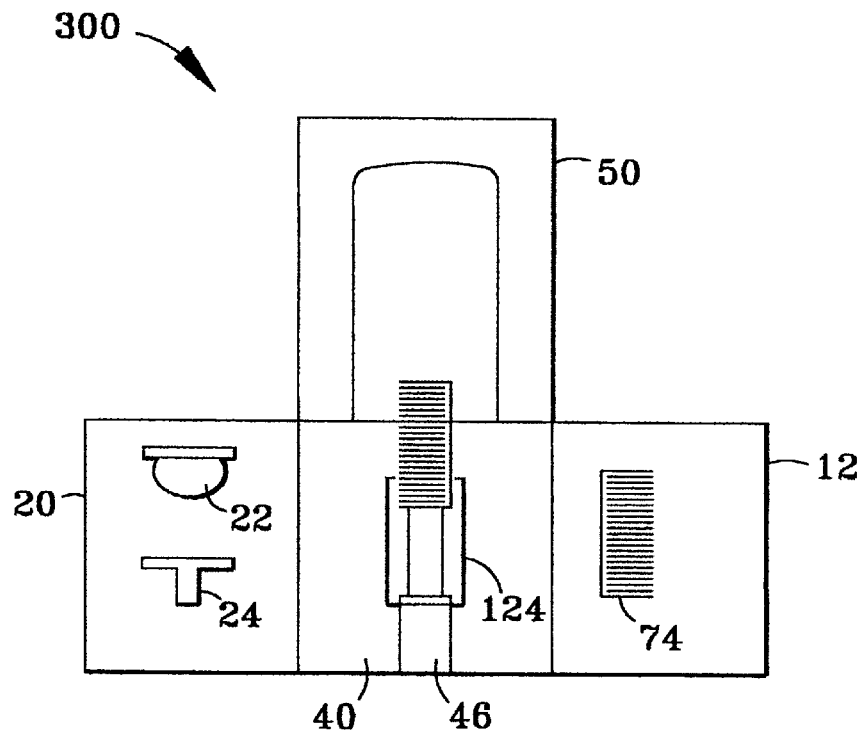
FIG. 6 is a cross section view of the second cluster-type wafer processing apparatus of FIG. 5 taken along the line 6—6.
Figure 7:
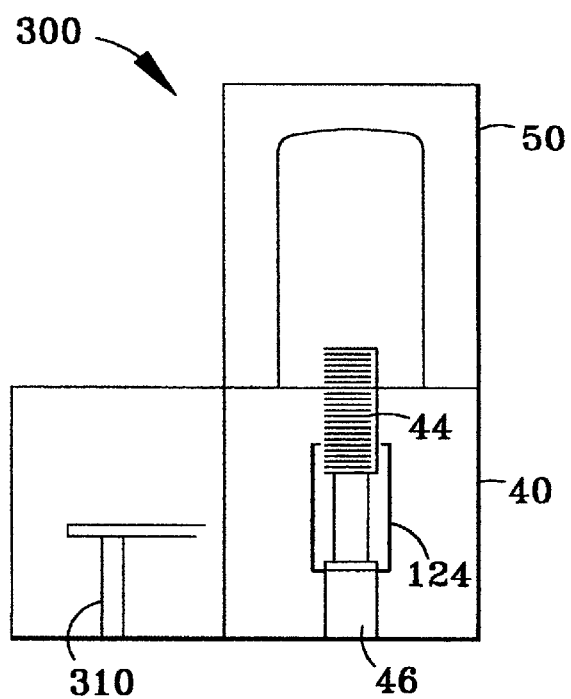
FIG. 7 is a cross section view of the second cluster-type wafer processing apparatus of FIG. 5 taken along the line 7—7.

With reference now to FIGS. 5–7, a second cluster-type wafer process apparatus 300 according to the present invention is now described. Apparatus 300 comprises a central chamber 304 which is preferably polygonal (e.g., chamber 304 is shown as being square, although other configurations may be used) around which is located a load/unload chamber 12 containing cassettes 14 and 74, an RTP chamber 20 containing heater unit 22 and pedestal 24, and chamber 40 (FIG. 6) containing cassette 44, cassette lifter 46 and chamber 124 surrounding cassette 44. Atop chamber 40 is chamber 50 selectively opened to chamber 40, as described above in connection with apparatus 10. Chambers 12, 20, and 40 are selectively opened to chamber 304. A single wafer handler 310 capable of handling and transferring wafers 16 between the various pedestals and cassettes in apparatus 300 is provided in chamber 304.

With continuing reference to FIGS. 5–7, apparatus 300 operates in a manner similar to apparatus 200, described above. Wafers 16 are loaded into cassette 14 located in chamber 12. Wafer handler 310 then transfers a wafer 16 to pedestal 24 located in chamber 20. This wafer 16 is then heated, and removed by wafer handler 310 and placed in cassette 44 located in chamber 40. This process is repeated until all the wafers 16 in cassette 14 are transferred to cassette 44.

When cassette 44 is loaded with wafers 16, chamber 124 is removed (or alternatively, top 125 is removed or opened, as shown) cassette 44 is lifted into chamber 50 via cassette lifter 46, and thermal or CVD processing of the wafers is initiated. Cassette lifter 46 then lowers cassette 44 to chamber 40. Wafer handler 310 is then activated and transfers the processed wafers 16 therein to cassette 74 in chamber 12 for removal from apparatus 10, as described above in connection with apparatus 120.

The above-described embodiments of the present invention are designed to reduce or eliminate the formation of a native oxide layer on the surface of a silicon wafer. However, the present invention also solves the problem of wafer slip associated with high temperature anneal/oxidation furnaces, wherein the furnace chamber and the RTP chamber(s) are typically not used at reduced pressures. For example, for a wafer process involving a 20 minute anneal at 1100° C., present-day apparatus requires a slow ramp in the furnace chamber to maintain temperature uniformity across the wafer to prevent wafer slip. The slow ramp prevents large temperature differences from arising between edge center regions of the wafers in the batch. This slow ramp-up in temperature is followed by the 20 minute anneal, followed by a similar ramp-down in temperature.

With reference again to FIG. 2 and apparatus 120, the method of the present invention is now described. A wafer 16 is delivered to pedestal 24 and is heated such that the wafer temperature is rapidly ramped to the processing temperature in chamber 20. Ramping times of 2–60 seconds are possible because the cross-wafer temperature is capable of being carefully controlled when heating such wafer singly. After wafer 16 is so heated, it is removed from pedestal 24 by wafer handler 81 and placed in cassette 44, which is surrounded by isothermal chamber 124. In a preferred embodiment, wafer handler 81 is heated to control the temperature of wafer 16 during its transfer to cassette 44.

When all the wafers 16 desired to be annealed are loaded in cassette 44, isothermal chamber 124 is opened or removed, the cassette lifted via cassette lifter 46 into chamber 50, the anneal carried out, and the cassette lowered back into chamber 40. At this point, wafer handler 81 removes wafers 16 on a first-in/first out basis to match the anneal time over the batch of wafers and transfers each wafer back to pedestal 24, which has been heated to accommodate the now high temperature (e.g., 1100° C.) wafer. The wafer temperature is then ramped down to the extraction temperature (e.g., 100° C.) at a rapid rate, e.g., 10–240 seconds. In this manner, wafer slip is avoided, a significant decrease in the wafer thermal budget consumption is allowed, and the system throughput is increased by drastically shortening the temperature ramping steps.

In all of the above-described embodiments of the invention, more than one of any particular chambers, such as chamber 20, chamber 30 or chamber 124, can be utilized to match the single wafer processing throughput to the throughput of chamber 50. Also, multiple chambers can be used to allow one step of RTP chamber 20/isothermal chamber 124 to load a cassette (e.g., cassette 44a, FIG. 4) while a second set unloads a finished cassette (e.g., cassette 44b, FIG. 4).

While the present invention has been described in terms of preferred embodiments and working examples, it should be understood that it is not so limited. On the contrary, it is intended to cover all alternatives, modifications and equivalents as may be included within the spirit and scope of the invention as defined in the appended claims.

What is claimed is:

1. A multi-chamber tool comprising;
   a) a first chamber configured to batch process a plurality of wafers;
   b) a second chamber configured to controllably cool a single wafer;
   c) a first temperature controlled wafer handler configured to transport a single wafer from said first chamber to said second chamber;
   d) a third chamber configured to controllably heat a single wafer; and
   e) a second temperature controlled wafer handler configured to transport a wafer from said second chamber to said third chamber.

2. A tool according to claim 1, wherein said first chamber is a hot process chamber.

3. A tool according to claim 1, wherein said second chamber is a hot process chamber.

4. A tool according to claim 1, wherein said first temperature controlled wafer handler is heated so as to control the temperature of said wafer during transport from said first chamber to said second chamber.

5. A tool according to claim 1, wherein said first temperature controlled wafer handler maintains the wafer at a substantially constant temperature during transport from said first chamber to said second chamber.

6. A tool according to claim 1, wherein said first temperature controlled wafer handler varies the temperature of the wafer during transport from said first to said second chamber.

7. A tool according to claim 1, wherein said second chamber cools said wafer at a rate in the range of 10° C.–100° C. per second.

8. A tool according to claim 1, further comprising a plurality of second chambers.

9. A tool according to claim 1, wherein said third chamber is a RTP chamber.

10. A tool according to claim 1, wherein said first temperature controlled wafer handler and said second temperature controlled wafer bandler comprise a single temperature controlled wafer handler.

11. A system for processing wafers comprising:
    a) a first chamber configured for single wafer processing;
    b) a second chamber configured for batch processing;
    c) a cooling chamber configured to contain a single wafer from said first chamber; and
    d) a wafer handler system configured to move a single wafer from said cooling chamber to said second chamber.

12. A system according to claim 11, wherein an inert environment is between said first and said second chambers.

13. A system according to claim 11, wherein said first chamber is used for performing a hot process.

14. A system according to claim 13, wherein said first chamber is an RTP chamber including a pedestal for holding a single wafer and a heater unit arranged so as to substantially uniformly and rapidly heat said single wafer.

15. A system according to claim 14, wherein said cooling chamber includes a pedestal for holding said single wafer.

16. A system according to claim 11, wherein said wafer handler system comprises a first loading chamber having a cassette for holding one or more wafers.

17. A system according to claim 16, wherein said first chamber is a RTP chamber, and wherein said first loading chamber is located adjacent said cooling chamber and is selectively opened thereto.

18. A system according to claim 16, wherein said first chamber is a RTP chamber, and wherein said first loading chamber is located adjacent said RTP chamber and is selectively opened thereto.

19. A system according to claim 16, wherein said second chamber comprises a thermal processing chamber located adjacent said first loading chamber and arranged to receive said cassette so as to perform a thermal process on the wafers in said cassette.

20. A system according to claim 19, wherein said thermal processing chamber comprises an LPCVD furnace.

21. A system according to claim 16, wherein said second chamber is used for deposition of a material selected from the group consisting of a dielectric material, a metal, a semiconductor material and a silicide.

22. A system according to claim 11, wherein said wafer handler system comprises a first wafer handler, wherein said first wafer handler is heated so as to control the temperature of a wafer supported by said wafer handler.

23. A system according to claim 11, wherein said first chamber and said second chamber are adjacent a central chamber and are selectively open thereto.

24. A system according to claim 23, further comprising a cooling chamber located adjacent said central chamber and selectively open thereto, and including a pedestal for holding said single wafer.

25. A system according to claim 24, further comprising a first loading chamber located adjacent said central chamber and selectively opened thereto, and having a first cassette for holding one or more wafers.

26. A system according to claim 23, further comprising a first loading chamber located adjacent said central chamber and selectively opened thereto, and having a first cassette for holding one or more wafers.

27. A system according to claim 23, wherein said central chamber is polygonal wit a plurality of sides, and wherein a first RTP chamber, said cooling chamber, a first loading chamber and an LPCVD chamber are located each along one side in said plurality of sides.

28. A system according to claim 27, further including a second RTP chamber adjacent said central chamber and selectively open thereto.

29. A system according to claim 27 wherein said first and said second chambers chamber have an inert or reducing environment and wherein said central chamber comprises an inert or reducing environment.

30. A system according to claim 23, further including a wafer handler located in said central chamber.

31. A system according to claim 23, wherein said wafer handler includes a wafer support structure that is heated so as to permit changes in wafer temperature to be controlled during wafer transport.

32. A wafer processing tool, comprising:
   a) a batch processing fixture configured for batch processing a plurality of wafers at a first elevated temperature, wherein said batch of wafers is not substantially cooled from that elevated temperature within said batch processing fixture;
   b) a single wafer heating apparatus configured for rapidly heating prior to said batch processing a wafer of said batch of wafers to a temperature substantially equal to said first elevated temperature;
   c) a single wafer cooling apparatus configured for rapidly cooling after said batch processing a single wafer of said batch of wafers from a temperature substantially equal to said first elevated temperature, without first heating the wafer from said first elevated temperature; and
   d) an apparatus for transferring the wafer from said single wafer heating apparatus to said batch processing fixture for said batch processing.

33. A wafer processing tool according to claim 32 wherein said single wafer heating apparatus maintains a substantially uniform temperature across said wafer during said rapid heating, and said single wafer cooling apparatus maintains a substantially uniform temperature across said wafer during cooling.

34. A wafer processing tool according to claim 32, wherein said single wafer cooling apparatus is capable of rapid single wafer cooling at a rate of at least 25C per second.

35. A wafer processing tool according to claim 34, further comprising a plurality of said single wafer cooling apparatuses.

36. A wafer processing tool, comprising:
   a) a batch processing fixture configured for batch processing a plurality of wafers at a first elevated temperature, wherein said batch of wafers is not substantially ramped in temperature within said batch processing fixture; and
   b) a single wafer processing apparatus configured for rapidly ramping temperature of a single wafer of the batch of wafers from said first elevated temperature, said;
   single wafer processing apparatus comprising a chuck to maintain a uniform temperature across the wafer during said ramping.

37. A system for processing wafers, comprising;
   a) a first chamber for single wafer processing;
   b) a second chamber for batch processing; and
   c) a wafer handler system for moving a wafer from said first chamber to said second chamber, said wafer handler system includes a cassette for holding one or more wafers and an isothermal chamber surrounding said cassette.

38. A system according to claim 37, wherein said isothermal chamber has a top that is openable or removable such that said cassette can be transferred through said isothermal chamber and into said second chamber.

39. A system according to claim 37, wherein said isothermal chamber includes sidewalls and is heated by at least one of (a) heating elements in contact with said sidewalls and (b) a flow of hot gas through said isothermal chamber.

40. An apparatus for processing wafers, comprising:
   a) a first chamber configured to controllably heat a single wafer;
   b) a second chamber configured to controllably cool a single wafer;
   c) a third chamber configured to perform a hot process on a batch of wafers;
   d) a first wafer handler system configured to transport a single wafer between said first chamber and said second chamber; and
   e) a second wafer handler system configured to transport a single wafer between said second chamber and said third chamber.

41. An apparatus according to claim 40 wherein said second wafer handler system transports wafers in batch.

42. An apparatus according to claim 40, wherein said first chamber performs a RTP process on a wafer.

43. An apparatus according to claim 40, wherein said first wafer handler system maintain the wafer at a substantially constant temperature during transport between said first chamber and said second chamber.

44. An apparatus according to claim 43, wherein said second wafer handler system maintains the wafer at a substantially constant temperature during transport between said second chamber and said third chamber.

45. An apparatus according to claim 40, wherein said second wafer handler system vanes the temperature of the wafer.

46. An apparatus for processing wafers, comprising:
   a) a first chamber configured to controllably heat a single wafer;
   b) a second chamber configured to maintain a single wafer at a uniform thermal profile;
   c) a third chamber configured to perform a hot process on a batch of wafers;
   d) a first wafer handler system configured to transport a single wafer between said first chamber and said second chamber; and
   e) a second wafer handler system configured to transport a single wafer between said second chamber and said third chamber.

47. An apparatus according to claim 46, wherein said second wafer handler system transports wafers in batch.

48. An apparatus according to claim 46, wherein said first chamber performs a RTP process on a wafer.

49. An apparatus according to claim 46, wherein said first wafer handler system maintain the wafer at a substantially constant temperature during transport between said first chamber and said second chamber.

50. An apparatus according to claim 49, wherein said second wafer handler system maintains the wafer at a substantially constant temperature during transport between said second chamber and said third chamber.

51. An apparatus according to claim 46, wherein said second wafer handler system varies the temperature of the wafer.

52. An apparatus according to claim 46, wherein said second chamber has a top that is openable or removable such that a wafer can be transferred by said second wafer handler system between said second chamber and said third chamber.

* * * * *